United States Patent [19]

Boschulte et al.

[11] 4,371,831
[45] Feb. 1, 1983

[54] MONITORING DEVICE FOR DISTINGUISHING THE OPERATING STATE OF A LOAD

[75] Inventors: Rainer Boschulte; Heinrich Koehnecke; Siegfried Muecke, all of Brunswick, Fed. Rep. of Germany

[73] Assignee: Siemens Aktiengesellschaft, Berlin & Munich, Fed. Rep. of Germany

[21] Appl. No.: 209,483

[22] Filed: Nov. 24, 1980

[30] Foreign Application Priority Data

Dec. 27, 1979 [DE] Fed. Rep. of Germany ....... 2952462

[51] Int. Cl.³ .............................................. G05F 1/00
[52] U.S. Cl. .................................. 323/284; 323/285; 323/902; 323/909; 340/515
[58] Field of Search ............... 323/274, 275, 284, 285, 323/221, 902, 909; 361/187; 340/514, 515, 517, 657, 660, 664; 307/116, 117, 125, 130, 131

[56] References Cited

U.S. PATENT DOCUMENTS

| | | |
|---|---|---|
| 3,159,772 | 12/1964 | van Doorn ........................ 361/187 |
| 3,341,748 | 9/1967 | Kammiller ........................ 361/187 |
| 3,582,926 | 6/1971 | Hassan ........................ 340/514 X |
| 3,679,965 | 7/1972 | Wilkinson ........................ 323/284 |
| 4,115,830 | 9/1978 | Stieber ........................ 361/187 |

FOREIGN PATENT DOCUMENTS

69/1938  3/1969  South Africa.

Primary Examiner—William M. Shoop
Assistant Examiner—Peter S. Wong
Attorney, Agent, or Firm—Hill, Van Santen, Steadman, Chiara & Simpson

[57] ABSTRACT

In a remote control system which is operated by way of a light wave guides, a monitoring device is provided for a remotely controllable load, the monitoring device measuring the current through the load and deriving values therefrom for the proper and the improper operating state of the load. All switches participating in the drive and monitoring functions with respect to the load are incorporated in a check concerning the operability of the monitor and of the load, the check being carried out during operation of the load.

3 Claims, 1 Drawing Figure

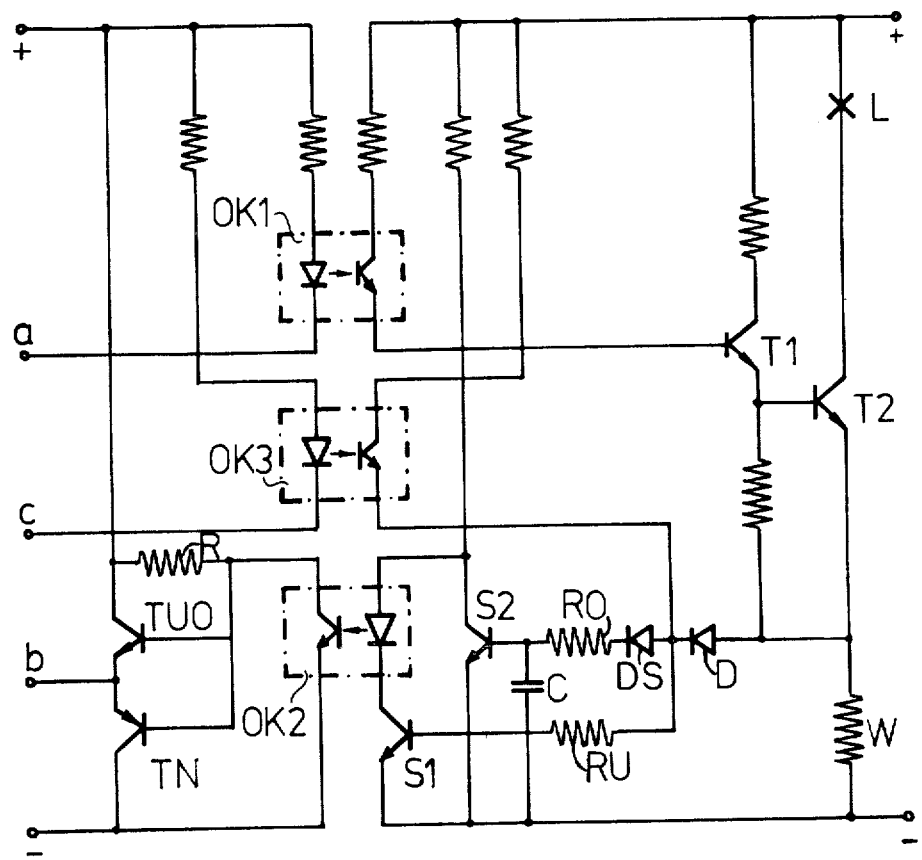

MONITORING DEVICE FOR DISTINGUISHING THE OPERATING STATE OF A LOAD

BACKGROUND OF THE INVENTION

1. Field of the Invention

The present invention relates to a monitoring device for distinguishing the operating state of an electrical load, and more particularly to such a devie which employs a monitor which is controllable by two threshold switches, the monitor being employed to output a first status report given a control potential supplied to the threshold switches, the control potential lying between a prescribed minimum value and a prescribed maximum value, and to output a second status report when these control potential limiting values are exceeded or fallen below.

2. Description of the Prior Art

For monitoring the operational status of electrical loads, for example, of the signal lamps of a light signal, it is not only known to identify the respective operating state of the electrical load by monitors connected in the current path of the load and to report the states to, for example, a central control location, but, rather, it is also known to check the proper operational behavior of the monitors. To this end, in a known remote control system (South African Letters Pat. No. 69/1938), the monitors are temporarily driven into one switching state and then into another switching state independently of the switching state of the electrical load monitored thereby. The receipt of the status reports for the monitors transmitted to the control location are converted at the control location into signals distinguishing the proper operational behavior of the monitors; given failure of the expected status reports, a failure report is triggered in order to initiate prescribed switching routines.

All in all, it is not sufficient to know whether an electrical load is traversed by current or not; in order to assure a specific operating behavior of the electrical load, a clear statement is necessary whether or not the current flowing through the load lies within prescribed limits. The load current at the connected load dare not lie below a prescribed threshold value, since the load cannot operate properly under such a condition; however, the load current also dare not exceed an upper value because the load can then be damaged. Moreover, the flow of a current lying above a prescribed threshold value can also be an indication that the measured load current is not flowing through the load but, rather, across a low-resistance bypass of the load.

A device for monitoring the upper and lower limiting values of a constant voltage level is known from U.S. Pat. No. 3,159,772, with which it is possible to identify whether a constant voltage to be monitored lies within a prescribed voltage range or deviates to an inadmissible degree from a nominal voltage. The device consist of two threshold switches to whose control inputs the constant voltage to be monitored is supplied; the response levels of the two threshold switches are determined by the prescribed minimum value and the prescribed maximum value of the constant voltage to be monitored. The threshold switches control a monitor connected thereto in such a manner that the monitor assumes one switching state given a constant voltage within the prescribed voltage range and assumes another switching state given a constant voltage beyond the prescribed voltage range.

The monitor of this known device can be checked as to operability during operation by employing techniques from South African Letters Pat. No. 69/1938, in that it is driven into its two possible operating states by supplying thereto separate check commands. The operability of the actual monitor can be tested by this check operation; the monitoring result, however, provides no information as to whether the switching structure by way of which the monitor is operationally controlled is, in turn, likewise operational, i.e. that the monitor in fact reacts in the desired manner to the control voltages of different magnitude.

SUMMARY OF THE INVENTION

The object of the present invention is to make useful the known device for monitoring the upper and lower limiting values of a constant voltage level, for distinguishing the operating state of an electrical load, and to provide a novel construction thereof in which the operability of all switching devices incorporated in the control and monitoring operation can be checked. One should be able to determine the operability independently of the operating state of the load to be monitored, i.e. both when the load is operationally connected and when the load is operationally disconnected. The load to be monitored should be incorporated in the check as to operability in addition to all switching devices participating in the actual control and monitoring operation. The monitoring device should not only exhibit high reliability, i.e. even malfunction and every component defect should be identifiable by a malfunction report, but a high reliability and a high utilizability of the monitoring device should be attainable by employing only a few, commercially-available components.

The above object is achieved, according to the present invention, for a monitoring device of the type generally set forth above, in that a precision resistor is connected in series with the load to be monitored, the precision resistor developing a control potential which is dependent on the load current. Two threshold switches are connected to the precision resistor, a first switch which reacts to the load current achieving a first predetermined minimum value and a second switch which reacts to the load current exceeding a predetermined maximum value. The second switch shunts the first switch and maintains the output thereof in a first state when the second switch is activated. Otherwise, the first switch, in response to a load current within the prescribed range, is conditioned to a second state. The state of the first switch is monitored by an output monitor circuit coupled to the first switch by way of an opto-coupler.

BRIEF DESCRIPTION OF THE DRAWINGS

Other objects, features and advantages of the invention, its organization, construction and operation will be best understood from the following detailed description, taken in conjunction with the accompanying drawings, on which there is a single FIGURE which is a schematic circuit diagram of a circuit arrangement for controlling and monitoring the operating state of a load.

DESCRIPTION OF THE PREFERRED EMBODIMENTS

Referring to the drawing, an exemplary embodiment of the invention is illustrated as comprising a switching structure for driving and monitoring a signal lamp, the switching structure arranged in the proximity of the signal lamp L, and another switching structure for implementing the performance check of the lamp and lamp monitor.

The signal lamp L is supplied from a voltage source, preferably a local voltage source, and is galvanically separated from the control and monitoring lines leading to the control location by interposed opto-couplers OK1–OK3. This has the advantage that the signals which can be tapped or, respectively, supplied at the left-hand portion of the circuit can lie at a potential which is independent of the voltage of, for example, 12 volts required for the operation of the signal lamp L and which is directly suitable for the processing of these signals in electronic circuits, for example 5 volts. The connection of the signal lamp occurs by the output-coupler OK1. The opto-coupler OK1 becomes low-resistant at its output side as soon as its input terminals a has ground potentials supplied thereto. The low resistance condition causes a through-connection of a transistor T1 connected to the opto-coupler OK1. The transistor T1 serves as a pre-amplifier for a power transistor T2 which has its collector-emitter path connected in series with the lamp L. As soon as it is connected, the signal lamp L draws a specific load current which causes a corresponding voltage drop at a precision resistor W, also connected in series with the signal lamp L. This voltage drop represents a control potential for two switches S1 and S2 which serve for controlling a lamp monitor.

If the current flowing through the precision resistor W lies above a lower threshold value prescribed for the signal lamp L, then the switch S1 is rendered conductive by the control potential supplied thereto via a decoupling diode D and a resistor RU. In its conducting state, the transistor S1 activates a luminescent diode of an opto-coupler OK2. The opto-coupler OK2 becomes low-resistant at its output side and thereby through-connects a transistor TN which connects ground potential to the terminal b. Ground potential at the terminal b indicates that the lamp monitor for the signal lamp registers a feed current which lies between the lower and upper admissible threshold values.

When the load current flowing through the precision resistor W exceeds a predetermined upper threshold value in an inadmissible manner, the potential tapped at the precision resistor W through-connects a second switch, a transistor S2, via the decoupling diode D, a resistor RO and a diode DS. This switch shunts the diode of the opto-coupler OK2 which had been connected up to this time by way of the transistor S1. Thereby, the photo transistor of the opto-coupler OK2 becomes high-resistant, which leads to a blocking of the previously through-connected transistor TN because of the positive potential now lying at its control input via a resistor R and through-connects a transistor TUO. Therefore, a positive potential is now applied to the terminal b, the positive potential being converted in an evaluation logic circuit (not illustrated) into a signal having the meaning "inadmissible deviation of the load current from its nominal value". The diode DS is connected into the control circuit of the second transistor S2; this diode assures that the transistor S2 only through-connects when the voltage supplied thereto is higher than the voltage required for operation of the first transistor S1, by an amount of the forward voltage of the diode DS.

When the load L is switched off, or a feed current flows across the load which lies below the predetermined, lower threshold value, then neither the transistor S1 nor the transistor S2 are rendered conductive. In this case, also, the output terminal b is charged with a positive potential via the transistor TUO. In interaction with the control potential applied to the terminal a, the potential which is tapped either distinguishes the proper state "load operationally disconnected" or the improper operating state "inadmissible deviation of the load current from its nominal value".

It is provided for the performance test of the monitor to temporarily conduct the monitor into the switching states into which it can arrive given load currents of different magnitude. If, at the time at which the performance check is to be carried out, the load is operationally connected, then the transistor S1 is through-connected given the proper operating state and ground potential can be tapped at the terminal b. It is then required for the performance check of the monitor to successively supply the monitor with control voltages which correspond to the control voltage which is supplied thereto given too low and too high of a load current. For checking the lower threshold value, the transistor T1 is blocked by a check command briefly applied to the input terminal a; this transistor switches the transistor T2 to a high-resistant state and the load is briefly disconnected. Thereby, the switching time is preferably to be dimensioned in such a manner that, although the monitor can register the lack of a load current, the operating state of the load is not yet changed. Given the design of a load as a signal lamp, the switching time for the temporary disconnection of the signal lamp should be selected so short that the human eye cannot follow the temporary shut-down operation. Given a load with non-optically perceptible operating states, one must assure that the brief disconnection of the load has no influence on following circuits by buffering the load, for example, by energy storage with a capacitor.

If the check operation is to be undertaken when the load is operationally disconnected, then a brief connection of the load is first initiated by applying ground potential to the terminal a; thereby, given the proper operating state of the switching structure participating in the connection and in the monitoring operation, the transistor S1 responds and emits the report for the flow of a sufficiently high load current to the opto-coupler OK2. Ground potential can thereby be tapped during this check phase at the terminal b. If, as in the present exemplary embodiment, the loads to be controlled and to be monitored are designed as signal lamps, then a problem occurs in that a cold current lying above the operating current temporarily flows when the load is connected. This current, which flows at an elevated magnitude only briefly, however, should not lead to the through-connection of the transistor S2 and, therefore, to the emission of a malfunction report. For this reason, a capacitor C is connected to the control input of the second transistor S2, the capacitor allowing a through-connection of the transistor S2 only when a sufficiently high control voltage is available for a longer time as determined by the capacitor C.

If the load L cannot be connected during the check operation, then the transistor S1 is also not through-connected and the corresponding reply (ground potential at the terminal b) does not take place. This reply likewise does not take place when, although the load is traversed by current, the transistor S1 is not reversible because of a defect, i.e. the monitoring device is not operating properly.

In order to check whether the monitor would emit a malfunction report given too high of a load current or not, it is, of course, not meaningful to charge the load with excess current.

On the contrary, the flow of such current is simulated during the check operation. To this end, given a connected load, a third switch OK3, likewise designed as an opto-coupler, is briefly through-connected by applying ground potential at a terminal c. The through-connection of the third switch leads to a potential shift at the control input of the second transistor S2. This potential shift is selected in such a manner that the control potential now applied at the control input of the transistor S2 corresponds to the potential supplied thereto by the precision resistor W given too high of a load current. Given a proper operating state of the monitoring device, the second transitor S2 shunts the first transistor S1 and the input side of the opto-coupler OK2 and thus directly applies positive potential to the terminal b.

A circuit for the load is closed during the performance check for the upper threshold value of the monitoring device. By so doing, it is achieved that the potential required for the through-connection of the first transistor S1 is applied to the control input of the transistor S1 during a check phase. The disconnection of the luminescent diode of the second opto-coupler during the check operation is to be clearly attributed to the effectiveness of the second switch.

If the load current were disconnected during the operational test for the upper threshold value of the monitoring device, then the extension of the luminescent diode of the opto-coupler OK2 need not of necessity be attributed to the activation of the second transistor S2; to the contrary, the luminescent diode also becomes dark only due to the disconnection of the load current when the transistor S1 becomes non-conductive. The status report conveyed in this check phase via the opto-coupler OK2 (it could be attributed, for example, to a defect in the opto-coupler OK3), would thus not be clear-cut and would thus not fulfill the goal placed thereon, namely checking the performance behavior of the monitoring device.

A practice of the present invention requires that it be provided by appropriate measures that the performance check of the monitor with respect to its upper threshold value always occurs given a connected load, or at least immediately after the charge of the monitor with a normally high feed current. Given an operationally disconnected load, the third switch OK3 is respectively to be through-connected immediately after the connection of the load; it is only in this manner that the proper operation of the monitor with respect to too low, too high and a normal load current magnitude can be determined. If the load is operationally connected, then a re-connection is required after its temporary, brief disconnection for check purposes and a through-connection of the third switch OK3 is only inadmissible subsequent thereto, since it is only given this switching sequence that the reaction of the monitor to the different load currents can be determined with certainty.

In the exemplary embodiment illustrated and described herein, the monitoring devices for distinguishing the operating state are only specified for a single load; given a plurality of load which are to be switched separately, a corresponding number of monitoring devices are to be employed. These monitoring devices can be operated independently of one another; however, they can also be dependent upon one another. If, for example, two loads to be controlled are a matter of the primary filament and the secondary filament of a signal lamp, of which the secondary filament is to be automatically connected with a defect occurs in the primary filament, then this automatic operation can be effected in that the terminal b of the monitoring device assigned to the primary filament is connected to the terminal a of the monitoring device assigned to the secondary filament, the connection being by the interposition of an inverter. The inverter, for example, can be designed as a switch which is controllable by the potential by the terminal b.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. A device for checking at least a first threshold switch in a monitoring device for distinguishing the operating states of a load, comprising:

said first threshold switch;

a second threshold switch connected to said first threshold switch and operable in response to a control potential above a predetermined maximum value to drive said first threshold switch into a first state, said first threshold switch operable in response to a control potential above a predetermined minimum value to switch from the first state to a second state;

a precision resistor connected in series with the load for providing a control potential representing the current through the load, said precision resistor connected to control said second threshold switch; and check means including a check signal input for receiving a check signal, said check means connected to said load, said precision resistor and said second threshold switch and operable in response to a control potential above a predetermined maximum value to operate said second threshold switch in response to receipt of a check signal and a control potential above a predetermined minimum value.

2. The checking device of claim 1, wherein:

said second threshold switch includes an input and a capacitor connected between said input and a reference potential.

3. The checking device of claim 1, and further comprising:

an opto-coupler including an output monitor switch, said opto-coupler connected to and controlled by said first threshold switch, said output monitor switch comprising a pair of transistors of different conductivity types each including a base, an emitter and a collector, the collector-emitter paths connected in series between first and second potentials, a resistor connecting said bases to the first potential and the output of said opto-coupler connecting said bases to the second potential.

* * * * *